United States Patent
Chung

(10) Patent No.: US 7,163,858 B2
(45) Date of Patent: Jan. 16, 2007

(54) METHOD OF FABRICATING DEEP TRENCH CAPACITOR

(75) Inventor: Chao-Hsi Chung, Hsinchu County (TW)

(73) Assignee: ProMOS Technologies Inc., Hsinchu (TW)

( * ) Notice: Subject to any disclaimer, the term of this patent is extended or adjusted under 35 U.S.C. 154(b) by 102 days.

(21) Appl. No.: 10/904,479

(22) Filed: Nov. 12, 2004

(65) Prior Publication Data

US 2006/0051916 A1    Mar. 9, 2006

(30) Foreign Application Priority Data

Sep. 9, 2004    (TW) .............................. 93127240 A

(51) Int. Cl.
*H01L 21/8242*    (2006.01)
*H01L 21/336*    (2006.01)

(52) U.S. Cl. ...................... 438/243; 438/268; 438/270

(58) Field of Classification Search ................ 438/243, 438/268, 386, 212, 253, 270
See application file for complete search history.

(56) References Cited

U.S. PATENT DOCUMENTS

| 6,680,237 | B1 * | 1/2004 | Chen et al. | 438/386 |
| 2006/0051916 | A1 * | 3/2006 | Chung | 438/243 |

* cited by examiner

*Primary Examiner*—Chuong Anh Luu
(74) *Attorney, Agent, or Firm*—Jiang Chyun IP Office

(57) ABSTRACT

A method of fabrication deep trench capacitors includes forming a plurality of deep trenches in a substrate. A bottom electrode is formed in the substrate surrounding the bottom of each deep trench. A capacitor dielectric layer and a first conductive layer are formed at the bottom of each deep trench. A collar oxide layer is formed on the sidewall of the deep trench exposed by the first conductive layer. A second conductive layer fills each deep trench. An opening is formed in a region predetermined for an isolation structure between adjacent deep trenches, wherein the depth of the opening is greater than that of the isolation structure. An isolation layer is filled in the opening.

16 Claims, 10 Drawing Sheets

METHOD OF FABRICATING DEEP TRENCH CAPACITOR

CROSS-REFERENCE TO RELATED APPLICATION

This application claims the priority benefit of Taiwan application serial no. 93127240, filed Sep. 9, 2004.

BACKGROUND OF THE INVENTION

1. Field of the Invention

The present invention relates to a dynamic random access memory (DRAM) and a fabrication method thereof. More particularly, the present invention relates to a deep trench capacitor and a fabrication method thereof.

2. Description of Related Art

As the device dimension being gradually reduced, the space for accommodating a capacitor of a DRAM device also diminishes. A trench capacitor formed in the substrate can effectively use the space provided by the substrate, and thus is compatible to the demand of the current market. The surface area of above-mentioned trench capacitor can be increased by increasing the depth of the trench. However, as a semiconductor device dimension continues to decrease, the trench dimension of the trench capacitor correspondingly reduces. Accordingly, the aspect ratio of the trench becomes larger and the photolithography process used in forming the deep trench becomes more difficult.

FIG. 1 is a schematic, upper view diagram illustrating an arrangement of a conventional DRAM. FIGS. 2A to 2D are schematic cross-sectional views along the cutting line I–I' of the diagram in FIG. 1 illustrating a plurality of deep trench capacitors in selected process steps of the fabrication.

Referring concurrently to both FIGS. 1 and 2A, a patterned mask layer 102 is formed on a substrate 100. Using the patterned mask layer 102 as an etching mask, a deep trench 104 is formed in the substrate.

Referring to FIG. 2B, a bottom electrode 106 is formed in the substrate 100 surrounding the bottom of the deep trench 104. A capacitor dielectric layer 108 and a conductive layer 110 are sequentially formed at the bottom of the deep trench. Thereafter, a collar oxide layer 112 is formed on the surfaces of the mask layer 102 and the conductive layer 110 and on the sidewall of the exposed deep trench 104.

Continuing to FIG. 2C, an anisotropic etching is performed to remove the collar oxide layer 112 on the surfaces of the conductive layer 110 and the mask layer 102, leaving only the collar oxide layer 112a on the sidewall of the deep trench 104. A conductive layer 114 is subsequently formed to fill the deep trench 104.

As shown in FIG. 2D, a portion of the conductive layer 114 is removed. Further, the collar oxide layer 112a that is not covered by the conductive layer 114 is also removed. A conductive material then fills the deep trench 104. After removing a portion of the conductive material, a conductive layer 116 is formed.

After the fabrication of the deep trench capacitor is completed, the fabrication of active devices is conducted. Referring to both FIGS. 1 and 2E, an isolation structure 120 is formed in the substrate 100 between two neighboring deep trenches 104 to define the device active regions 118. Thereafter, the patterned mask layer 102 is removed to form the transistors 122 on the surfaces of the isolation structure 120 and the substrate 100.

However, the aforementioned process comprises the following problems.

Due to the increase in density of device integration, the distance between two neighboring deep trenches 104 will be reduced during the fabrication of the deep trench capacitor in order to effectively utilize the area of the wafer. In such a case, a portion of the mask layer 102 between the two neighboring deep trenches 104 will easily be removed during the defining of the deep trenches 104. The substrate 100 underneath the mask layer 102 may also be removed (as indicated by the arrows 124 and 126 in FIG. 2A). In other words, the top film layers (for example, mask layer and the underlying substrate thereof) are etched. For example, portions of the mask layer 102 and the underlying substrate 100 as indicated by the arrow 124 in FIG. 2A are removed, and the depth of the two layers being removed is shallower than the depth 128 of a predetermined shallow trench isolation structure 120. The defect as indicated by the arrow 126 is more a serious issue. The mask layer 102 and a substantial portion of the substrate 100 are removed, wherein the depth of the two layers being removed is greater than the depth 128 of the predetermined shallow trench isolation structure 120.

The defect as indicated by the arrow 126 will affect the subsequent process, leading the formation of an ineffective device. For example, as shown in FIG. 2E, due to the defect as indicated by arrow 126 in FIG. 2A, the two neighboring deep trenches 104 can not be completely isolated (as indicated by arrow 130) even after the formation of the isolation structure 120. As a result, the conductive layers 114 in the neighboring deep trenches 104 are electrically connected to create a short in the device. Further, the operation of the capacitor may also be affected. The aforementioned problems are more prominent in the processing of small dimension devices.

SUMMARY OF THE INVENTION

Accordingly, one object of the present invention is to provide a fabrication method for a deep trench capacitor, wherein the generation of an electrical short in the device due to the film layer at the top part of the deep trench capacitor being etched is prevented. Further, the depth of the deep trench can be deepened, and the capacity of the deep trench capacitor is concurrently increased.

Another object of the present invention is to provide a deep trench capacitor, wherein an electrical short in a device can be prevented to obviate the capacitor from being inoperative. Hence, the yield of the process and the reliability of the device are increased.

One aspect of the present invention provides a fabrication method for a deep trench capacitor, wherein this method includes using a patterned mask layer disposed over a substrate to perform a patterning process to form a plurality of deep trenches in the substrate. A bottom electrode is then formed in the substrate surrounding the bottom of each deep trench. Thereafter, a capacitor dielectric layer is formed on the surface of each deep trench. A first conductive layer is formed filling the bottom of each deep trench, and the capacitor dielectric layer that is not covered by the first conductive layer is removed. A collar oxide layer is formed on the sidewall of the deep trench exposed by the first conductive layer. A second conductive layer is formed at least completely filling each deep trench. The patterned mask layer and a portion of the substrate between two adjacent deep trenches are removed to form a first opening, wherein the first opening is formed at a region predetermined for forming the isolation structure between two adjacent deep trenches. Further, the depth of the first opening is greater than the depth of the predetermined deep trenches. Thereafter, an isolation material fills the first opening.

According to one embodiment of the present invention, forming the above first opening includes forming a patterned photoresist layer on the patterned mask layer and a part of the second conducive layer, wherein the patterned photoresist layer exposes a region predetermined for the first opening. The patterned mask layer exposed by the patterned photoresist layer and a part of the substrate underneath are removed. An etching process is performed to remove a part of the second conductive layer. The photoresist layer is then removed followed by removing the collar oxide layer not covered by the second conductive layer. Removing the collar oxide layer not covered by the second conductive layer includes using a buffer hydrofluoric acid.

According to one embodiment of the invention, the bottom of the first opening is about 3500 angstroms to about 4000 angstroms below the surface of the substrate.

According to another embodiment of the invention, the isolation layer comprises a silicon oxide material. The isolation layer is formed by filling an insulation material layer in the first opening wherein the insulation material layer outside the first opening is removed. The insulation material layer is formed by performing a high density plasma chemical vapor deposition process or a semi-atmospheric chemical vapor deposition process, for example, and the insulation material layer outside the first opening is removed by performing a chemical mechanical polishing process or an etching-back process, for example.

According to another embodiment of the present invention, the second conductive layer and the collar oxide layer at the periphery of the isolation layer are further removed to form corresponding second openings. A third conductive layer is then filled in each second opening. The depth of the first opening is greater than that of the second opening. Moreover, before forming the second openings and filling the second openings with the third conductive layer, a portion of the isolation layer is removed to expand the width of the second opening. Removing the portion of the isolation layer includes using a a buffer hydrofluoric acid.

According to one embodiment of the invention, after forming the second openings and before filling the third conductive layer, further includes forming a dielectric layer on the exposed substrate of the sidewall of the second opening. Moreover, after filling the conductive layer, an isolation structure is formed in parts of the isolation layer, the third conductive layer and the second conductive layer. Forming the isolation structure further includes forming a buried strap in the substrate next to the third conductive layer.

In one embodiment of the invention, when the patterning process is performed to form the deep trenches, the patterned mask layer and a portion of the substrate between two adjacent deep trenches are also removed.

Another aspect of the present invention provides a deep trench capacitor, wherein the deep trench capacitor is disposed at a deep trench in the substrate. The deep trench capacitor includes a bottom electrode, a first conductive layer, a capacitor dielectric layer, a second dielectric layer, a collar oxide layer, a third conductive layer, an isolation structure and an isolation layer. The bottom electrode is disposed in the substrate at the bottom of the deep trench, and the first conductive layer is disposed in the deep trench. Moreover, the capacitor dielectric layer is disposed between the surface of the deep trench and the first conductive layer. The second conductive layer is disposed in the deep trench and is above the first conductive layer. Moreover, the collar oxide layer is disposed between the surface of the deep trench and the second conductive layer. The third conductive layer is disposed in the deep trench and is above the second conductive layer. The isolation structure is disposed in parts of the third conductive layer and the second conductive layer, and is in a part of the substrate. The isolation layer is disposed underneath the isolation structure, and is in a part of the second conductive layer and the substrate.

According to one embodiment of the present invention, the deep trench capacitor further includes a dielectric layer. The above dielectric layer is disposed between a sidewall of the deep trench and the third conductive layer.

In accordance to the present invention, before forming the isolation structure, an isolation layer fills each deep trench to assure the adjacent deep trenches are completely isolated even the top film layer is etched. As a result, even with the top film layer being etched, the problems of an electrical short in the device and an inoperative capacitor are prevented. Moreover, the present invention can provide a deep trench capacitor with a greater depth to increase the capacity. In other words, the present invention is contrary to the conventional practice, in which a shallower trench is formed for preventing the top film layer of the deep trench capacitor from being etched and from affecting the yield and the reliability of the device. The present invention can provide a deeper trench to have a higher capacity, while the problem of generating an electrical short in the device due to the top film layer being etched during the manufacturing process is also prevented.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
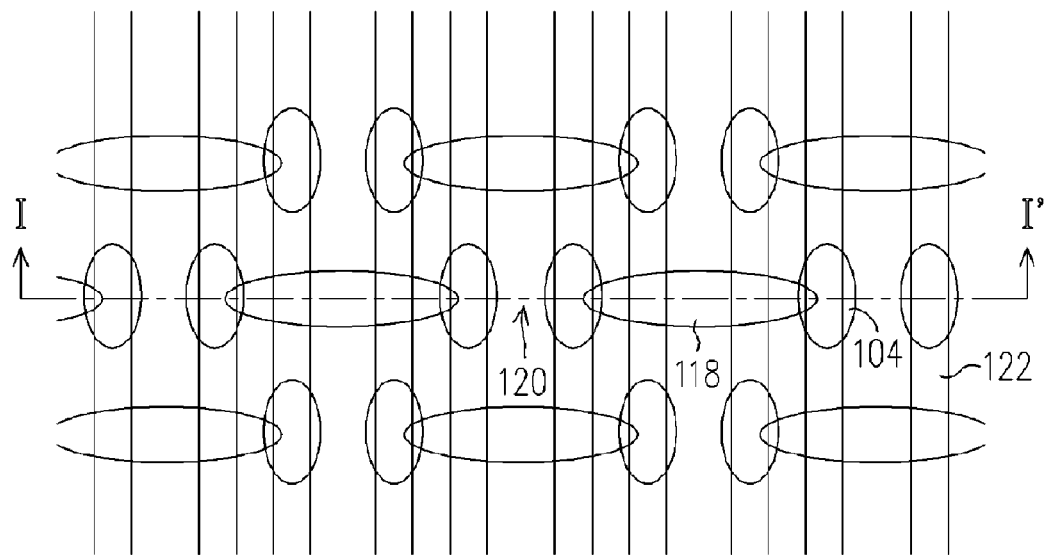
FIG. 1 is a schematic, upper view diagram illustrating an arrangement of a conventional dynamic random access memory.
Figure 2A:
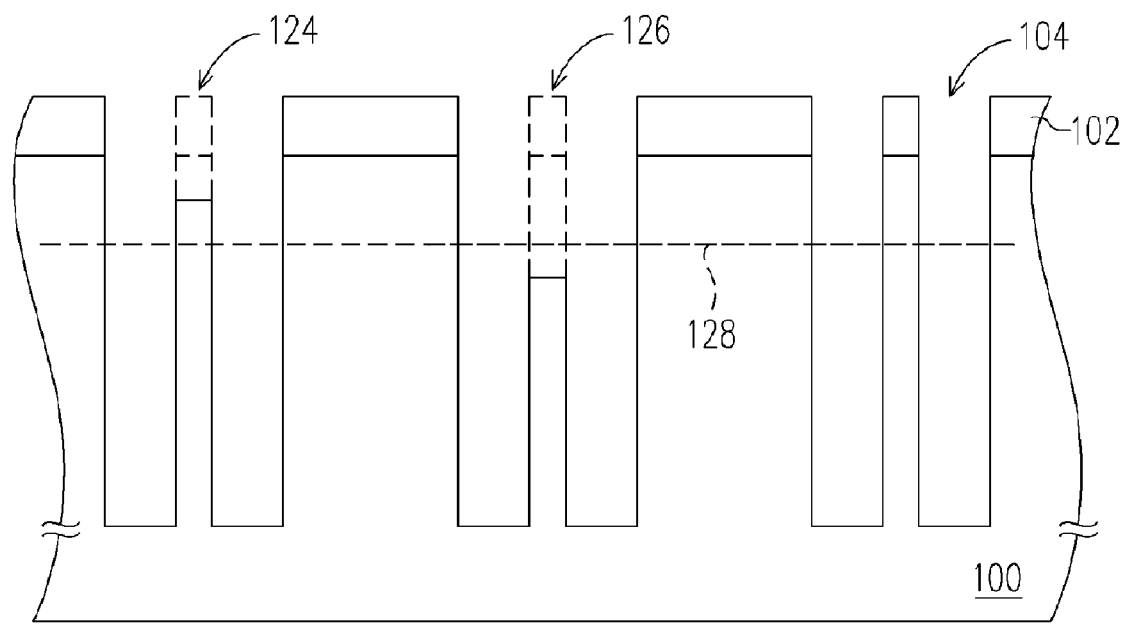
FIGS. 2A to 2D are schematic, cross-sectional views along the cutting line I–I' of the diagram in FIG. 1 illustrating a plurality of deep trench capacitors in selected process steps of the fabrication.
Figure 2B:
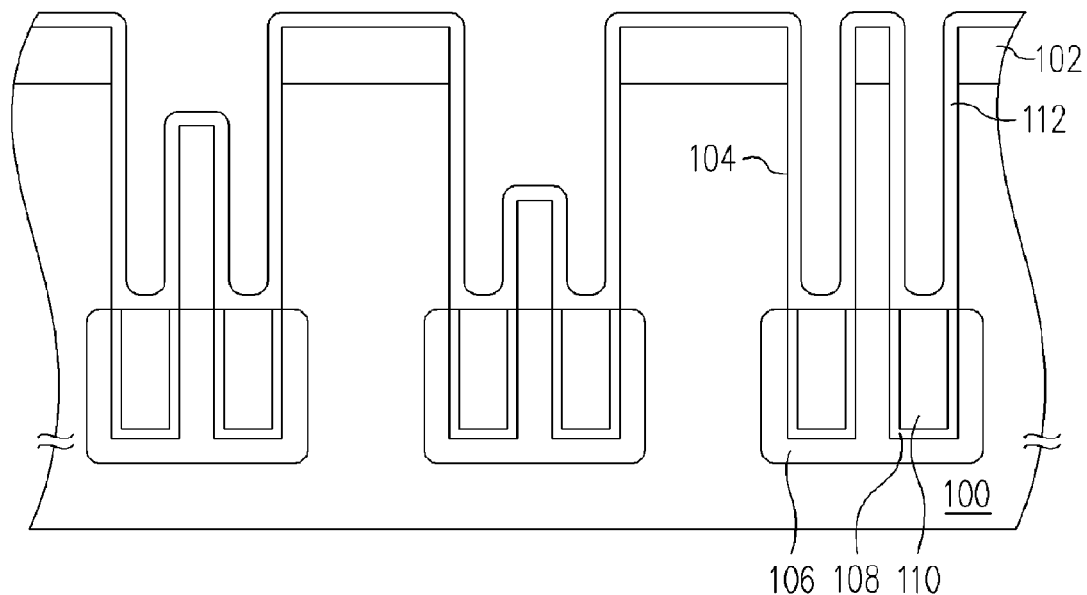
Figure 2C:
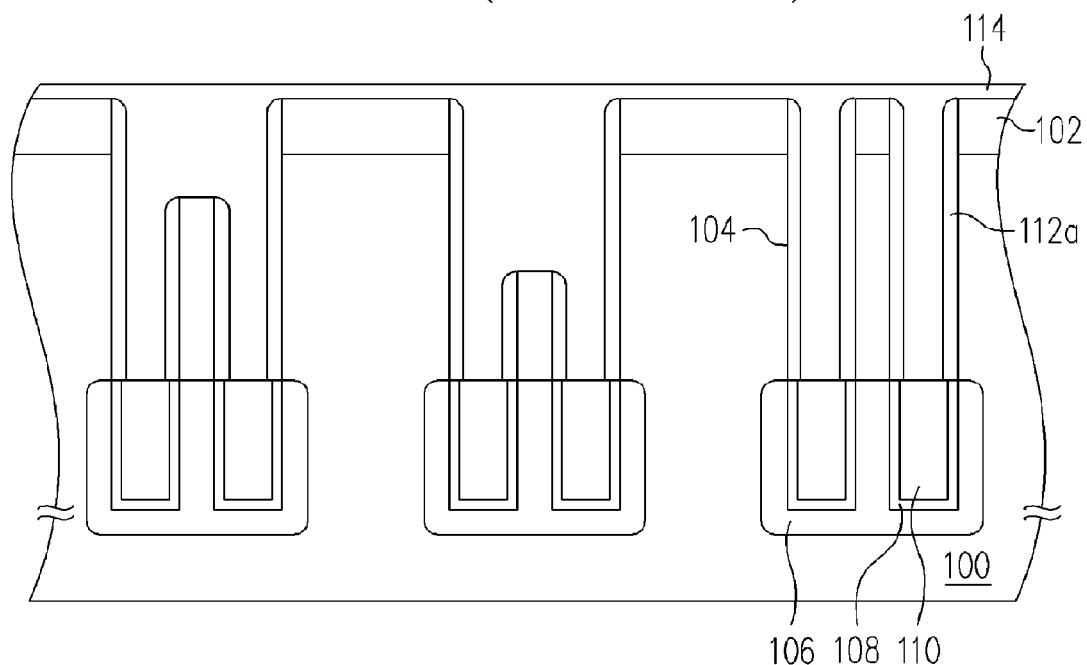
Figure 2D:
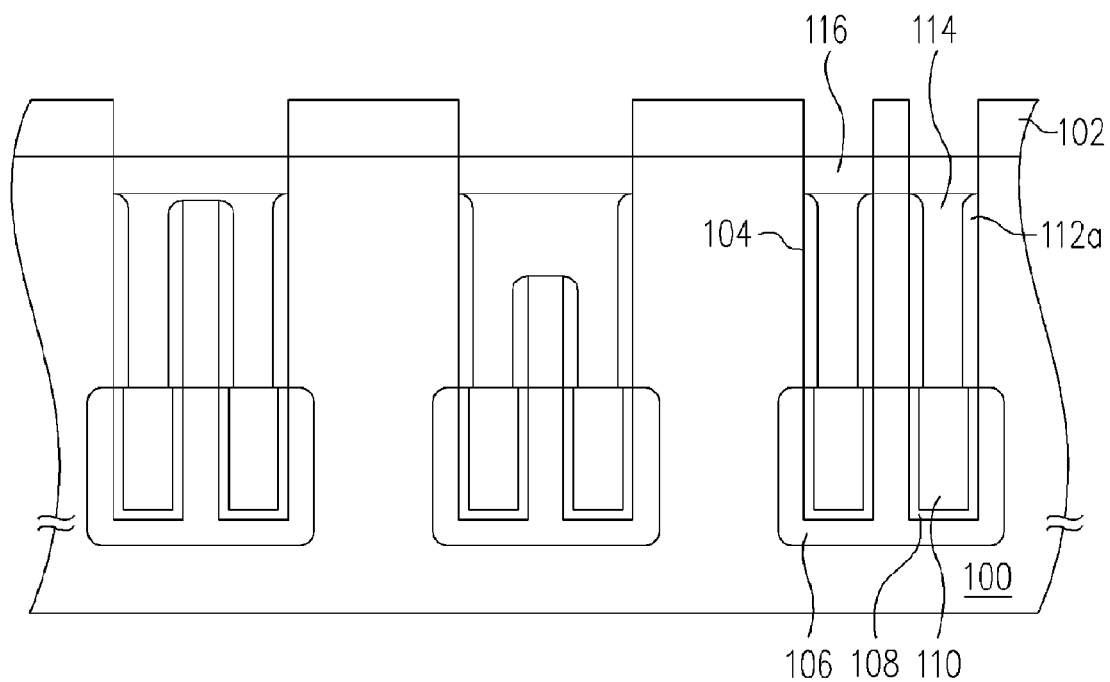
Figure 2E:
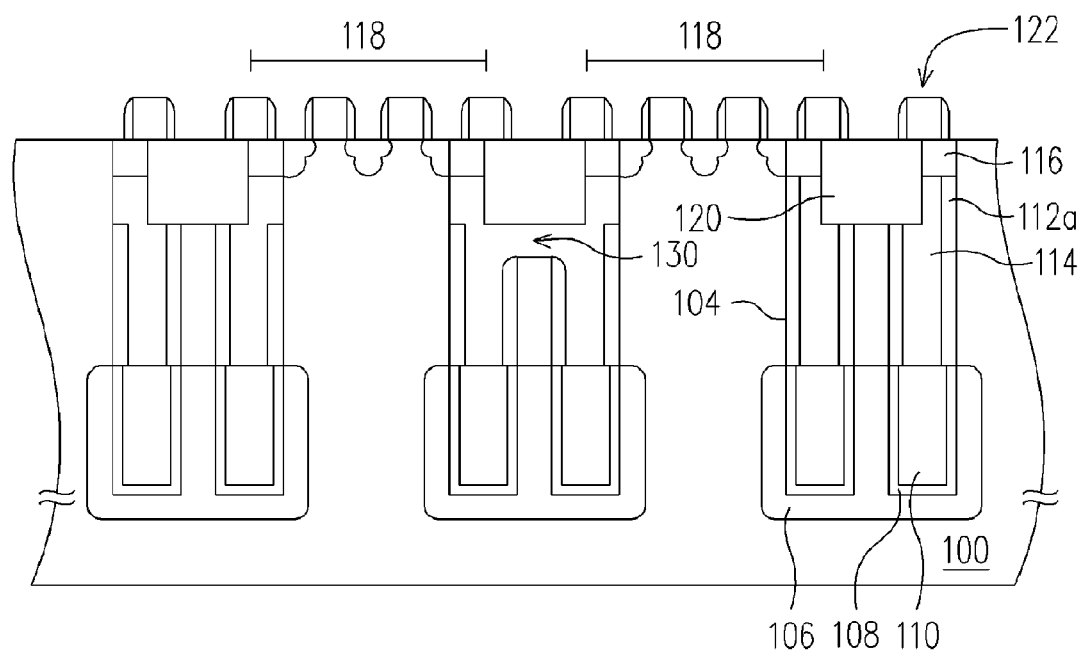
FIG. 2E is a schematic cross-sectional view illustrating the plurality of deep trench capacitors in a selected process of the fabrication according to the prior art.
Figure 3:
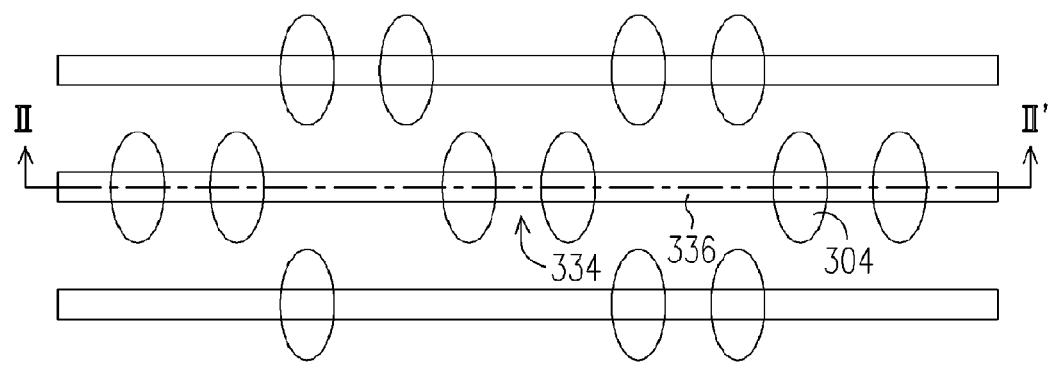
FIG. 3 is a schematic, upper view diagram illustrating an arrangement of a plurality of deep trench capacitors according to one embodiment of the present invention.

FIG. 3 is a schematic, upper view diagram illustrating an arrangement of a plurality of deep trench capacitors according to one embodiment of the present invention. FIGS. 4A to 4J are schematic, cross-sectional views along the cutting line II–II' of the diagram in FIG. 3 illustrating a plurality of deep trench capacitors in selected process steps of the fabrication.

Figure 4A:
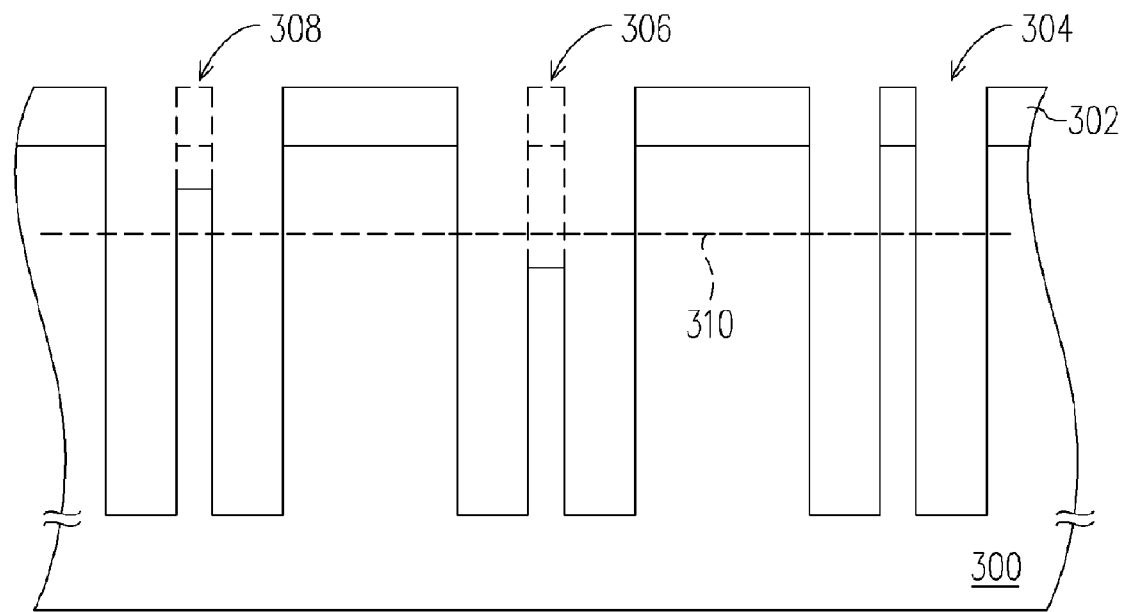
FIGS. 4A to 4J are schematic, cross-sectional views along the cutting line II–II' of the diagram in FIG. 3 illustrating a plurality of deep trench capacitors in selected process steps of the fabrication.

Referring to both FIGS. 3 and 4A, a patterned mask layer 302, disposed above a substrate 300, is used to perform a patterning process to form a plurality of deep trenches 304 in the substrate 300.

A material used for the patterned mask layer 302 includes silicon nitride, for example. The patterned mask layer 302 is formed by, for example, blankly forming a mask material layer over the substrate 300 by means of chemical vapor deposition, followed by conducting photolithography and etching processes on the mask material layer. The deep trenches 304 are formed by, for example, using the patterned mask layer 302 as an etching mask to perform an etching process on the substrate 300.

However, as shown in FIG. 4A, during the patterning process to form the deep trenches 304, certain parts of the patterned mask layer 302 and the substrate between two neighboring trenches 304 (as indicated by the arrows 306 and 308) are sometimes removed. The amount of the patterned mask layer 302 and the substrate 300 removed as indicated by the arrow 308 is less than the depth 310 of a predetermined isolation structure, while the amount of the patterned mask layer 302 and the substrate 300 removed as indicated by the arrow 306 is greater than the depth 310 of the predetermined isolation structure. If these defects, as indicated by the above arrows 306 and 308, that are generated during the manufacturing process are not properly rectified, the reliability and the yield of the resultant device are adversely affected.

Figure 4B:
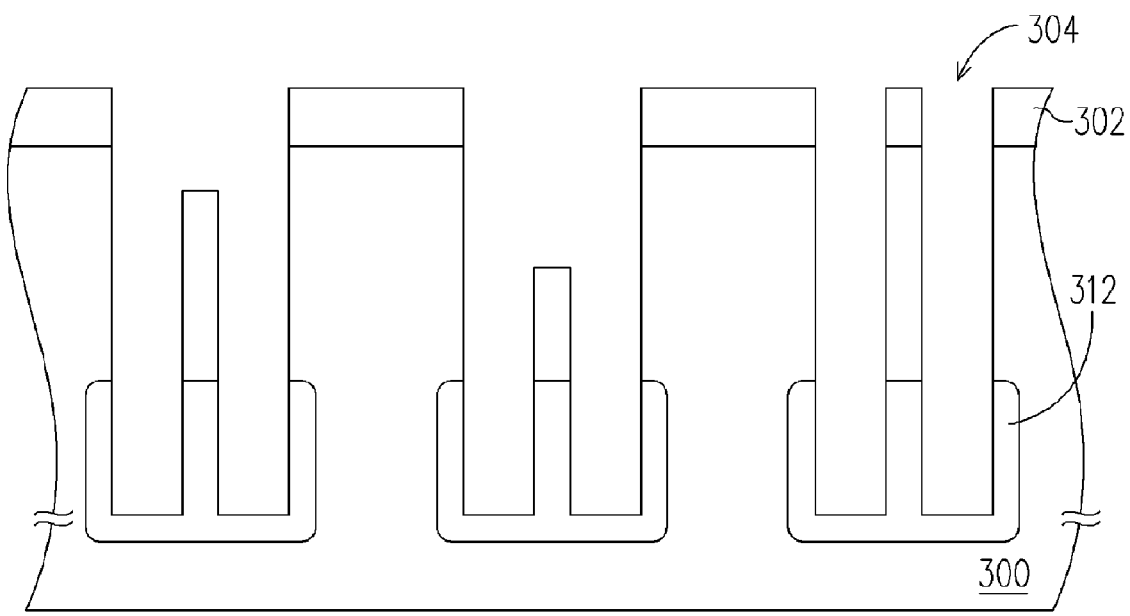

Referring to FIG. 4B, a bottom electrode 312 is formed in the substrate 300 surrounding the bottom of each trench 304. The bottom electrode 312 is formed by, for example, forming a doped silicon oxide layer on the surface of the inner sidewall of each deep trench, followed by performing a thermal process, in which the dopants diffuse from the doped silicon oxide layer to the substrate 300 outside the deep trench 304, and thereby forming the bottom electrode 312. The doped silicon oxide layer is doped with, for example, arsenic ions, and the doped silicon oxide layer is formed by, for example, low pressure chemical vapor deposition (LPCVD).

Figure 4C:
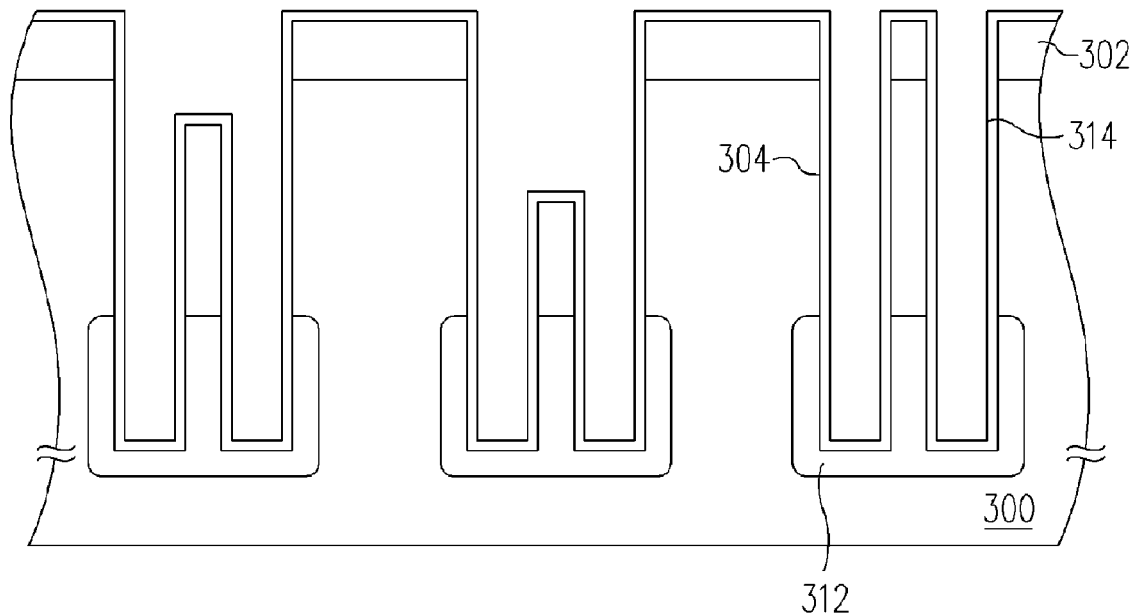

Thereafter, as shown in FIG. 4C, a capacitor dielectric layer 314 is formed on the surface of each deep trench 304, wherein the capacitor dielectric layer 314 is formed with a silicon oxide or a silicon nitride material, for example. Further, the capacitor dielectric layer 314 is formed by, for example, thermal oxidation or chemical vapor deposition.

Figure 4D:
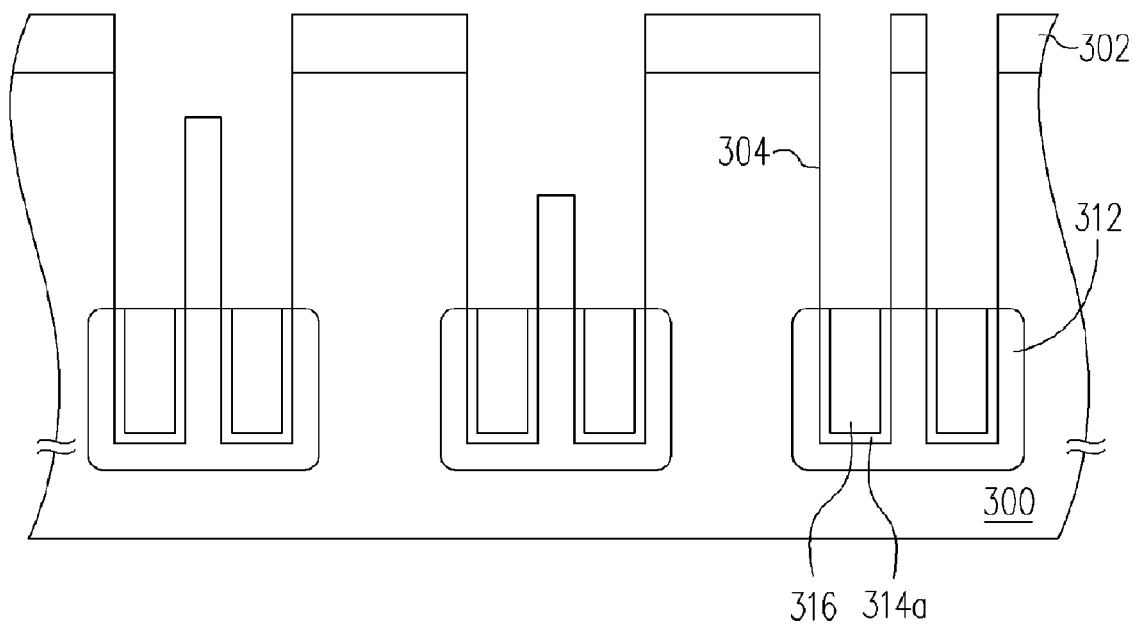

Continuing to FIG. 4D, a conductive layer 316 is filled in the bottom part of each deep trench 304. The capacitor dielectric layer 314 that is not covered by the conductive layer 316 is removed. Filling the bottom part of each deep trench 304 is accomplished by applying chemical vapor deposition to form a doped polysilicon layer that covers the patterned mask layer 302 and fills each deep trench 304, and followed by performing an etching-back process to remove the portion of the doped polysilicon layer outside the deep trenches 304 and at the top of each deep trench 304. Removing the portion of the doped polysilicon layer outside the deep trenches 304 and at the top of each deep trench 304 includes performing dry etching or wet etching. Further, the capacitor dielectric layer 314 not covered by the conductive layer 316 is removed by, for example, wet or dry etching to form the capacitor dielectric layer 314a.

Figure 4E:
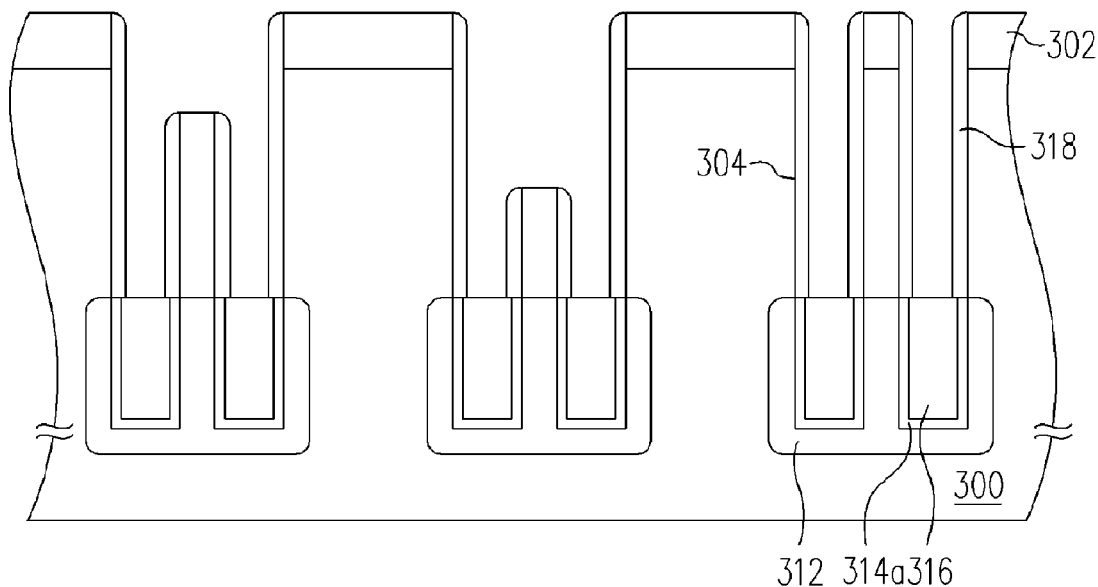

Referring to FIG. 4E, a collar oxide layer 318 is formed on the sidewall of each deep trench 304 exposed by the conductive layer 316. The collar oxide layer 318 is formed by, for example, forming a collar oxide material layer on the surfaces of the patterned mask layer 302 and each deep trench 304, and followed by performing an anisotropic etching process to remove the collar oxide material layer on the surfaces of the patterned mask layer 302 and the conductive layer 316, leaving behind the collar oxide layer 318 on the exposed sidewall of the deep trench 304. The collar oxide material layer is formed by, for example, chemical vapor deposition using ozone ($O_3$) and tetraethyl orthosilicate (TEOS) as reacting gases.

Figure 4F:
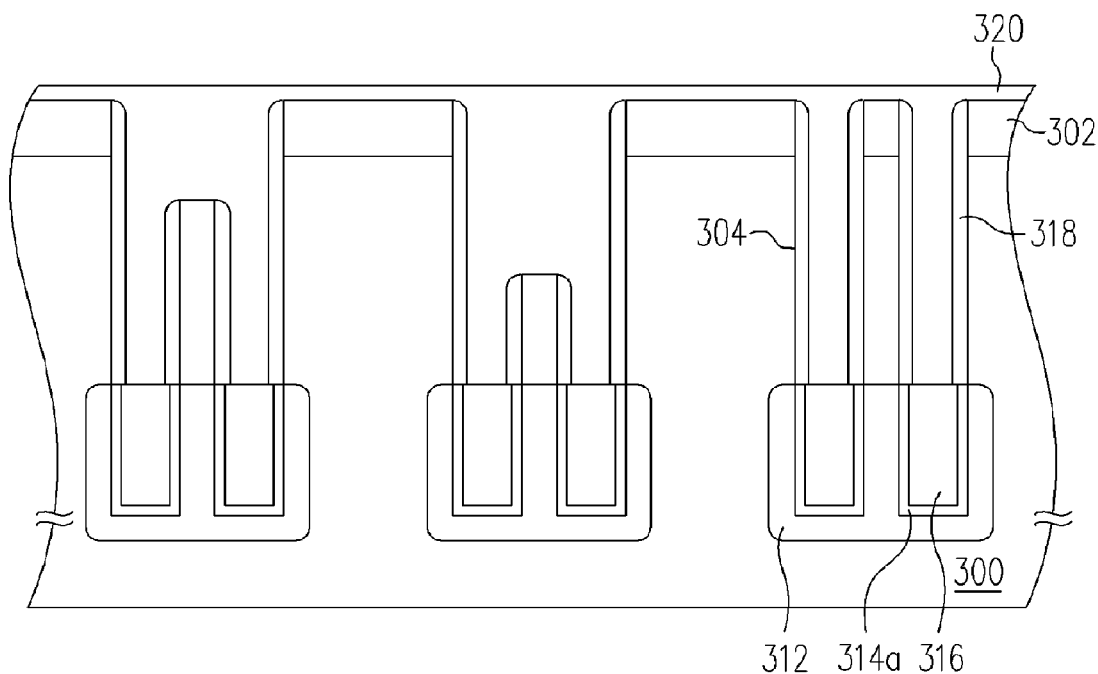

Continuing to FIG. 4F, each deep trench 304 is filled with a conductive layer 320, and the conductive layer 320 at least completely fills each deep trench 304. Filling each deep trench 304 with the conductive layer 320 is accomplished by performing chemical vapor deposition, for example, and the conductive layer 320 includes doped polysilicon layer.

Figure 4G:
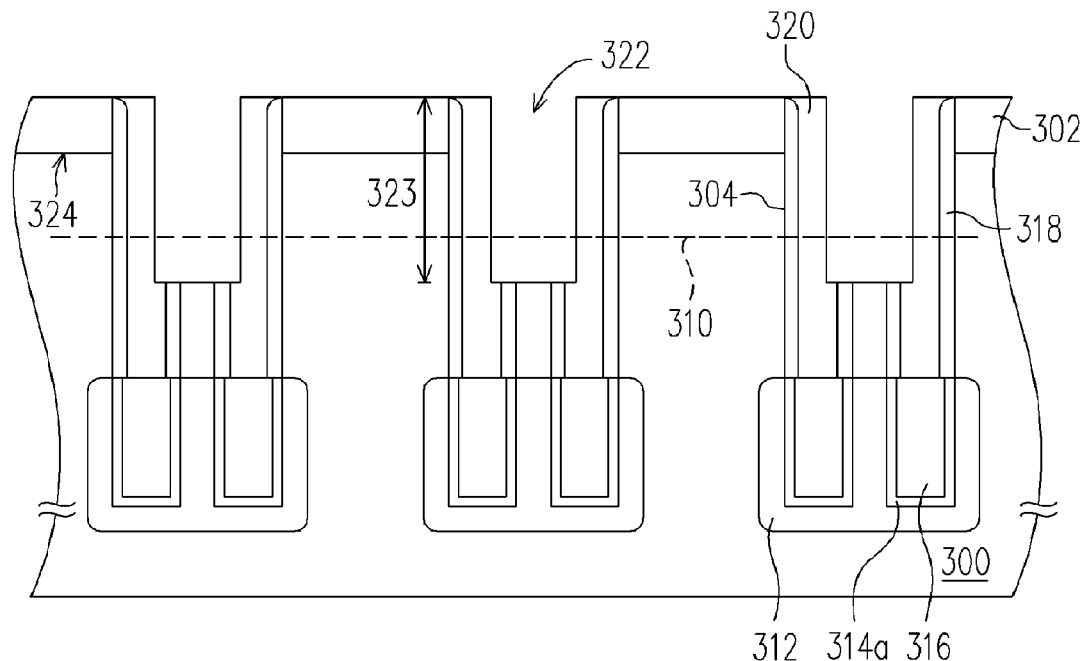

Referring to FIG. 4G, the patterned mask layer 302 and a portion of the substrate 300 that are positioned between two neighboring deep trenches 304 are removed. Portions of the collar oxide layer 318 and the conductive layer 320 inside each deep trench 304 are also removed to form an opening 322. The opening 322 is formed at a region predetermined for forming an isolation structure between two neighboring deep trenches 304. The depth 323 of the opening 322 is greater than the depth 310 of the predetermined isolation structure. In one embodiment, the bottom of the above-mentioned opening 322 is positioned about 3500 angstroms to 4000 angstroms below the substrate surface 324.

The opening 322 is formed by, forming a patterned photoresist layer (not shown) on the patterned mask layer 302 and a part of the conductive layer 320, for example, wherein the patterned photoresist layer exposes a region for the predetermined opening 322. After removing the patterned mask layer 302 between two adjacent deep trenches and a portion of the substrate 300 underneath, an etching process is then performed to remove a part of the conductive layer 320, and followed by removing the photoresist layer. The collar oxide layer 31 8 not covered by the conductive layer 320 is also removed. The collar oxide 31 8 is removed by, for example, using a buffer hydrofluoric acid (BHF) as an etchant.

Figure 4H:
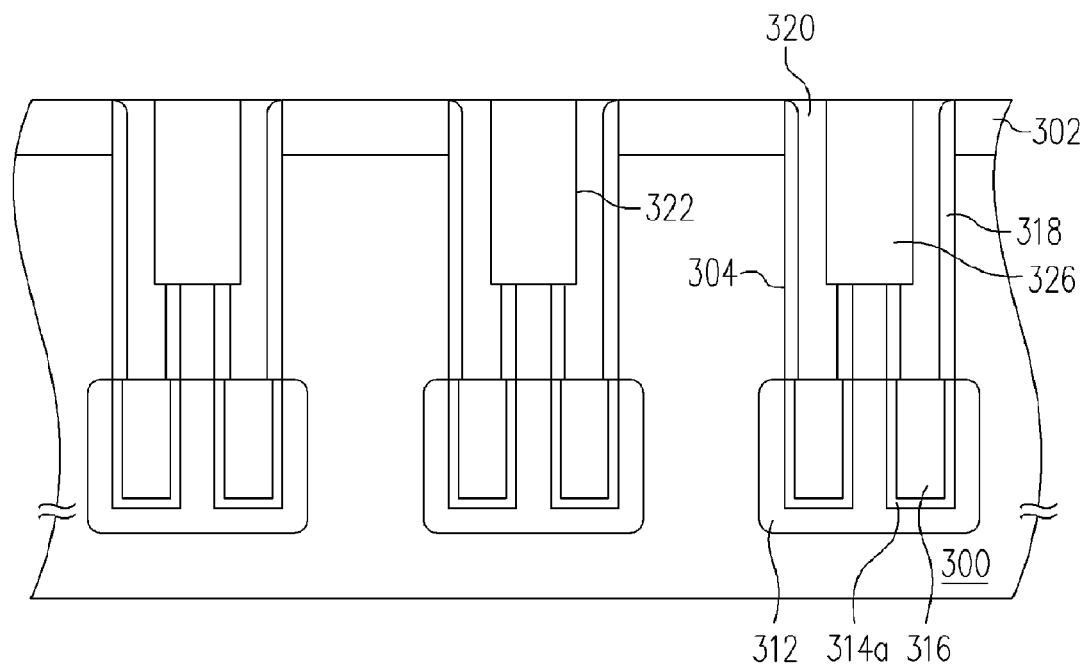

Referring to FIG. 4H, an isolation layer 326 is filled in the opening 322, wherein the isolation layer 326 is formed with a silicon oxide material, for example. The isolation layer 326 is formed by, for example, filling an insulation material layer in the opening 322, wherein the insulation material layer is formed by performing high density plasma chemical vapor deposition (HDP-CVD) or sub-atmospheric chemical vapor deposition (SA-CVD). Thereafter, the insulation material layer outside the opening 322 is removed to form the isolation layer 326, wherein the insulation material layer is removed by a chemical mechanical polishing (CMP) process or an etching-back process.

In the present invention, the depth 323 of the above-mentioned opening 322 is greater than the depth 310 of the predetermined isolation structure. Therefore, if defect, as indicated by the arrow 306 in FIG. 4, is created at certain region of the substrate 300 during the manufacturing process, filling the opening 322, which has a depth greater than the depth 310 of a predetermined isolation structure, with an isolation layer 326 can isolate the deep trenches 304 from one another effectively.

Figure 4I:
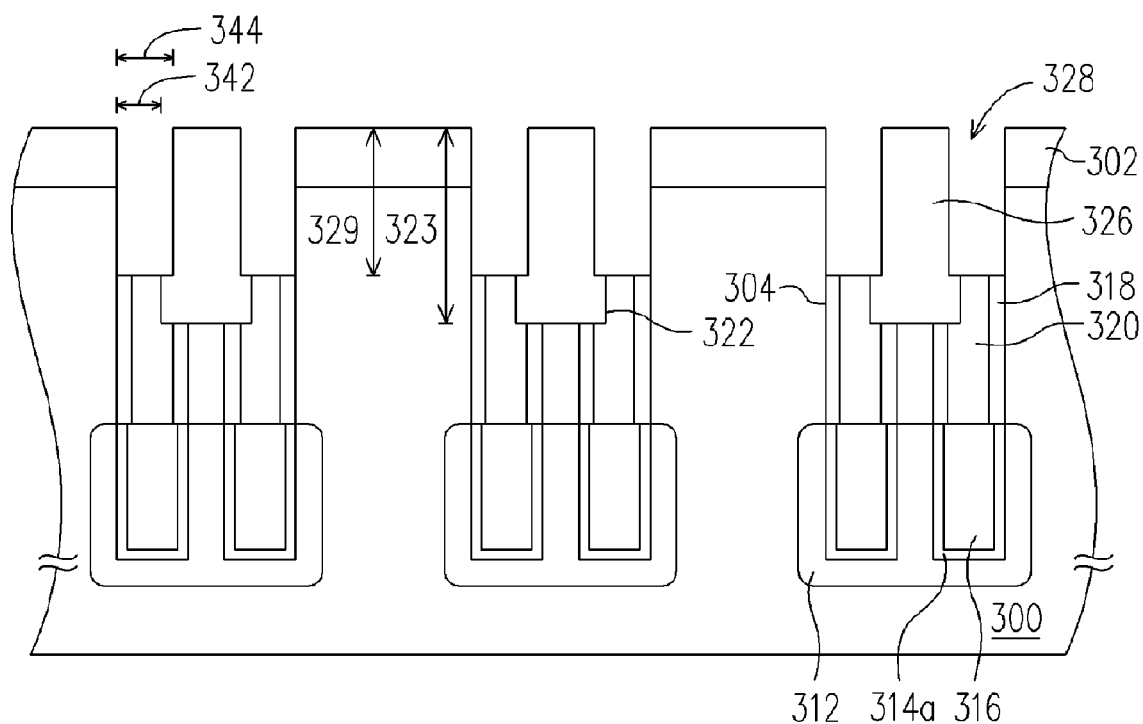

As shown in FIG. 4I, portions of the conductive layer 320 and the collar oxide layer 318 at the periphery of the isolation layer 326 are removed to form corresponding openings 328, where the depth 329 of each opening 328 is shallower than the depth 323 of the opening 322.

In one embodiment of the invention, after forming the above-mentioned opening 328, a portion of the isolation layer 326 is removed to expand the width of the opening 328, for example, the width 342 of the opening 328 is expanded to the width 344. Removing the portion of the isolation layer 326 includes using a buffer hydrofluoric acid as an etchant.

Figure 4J:
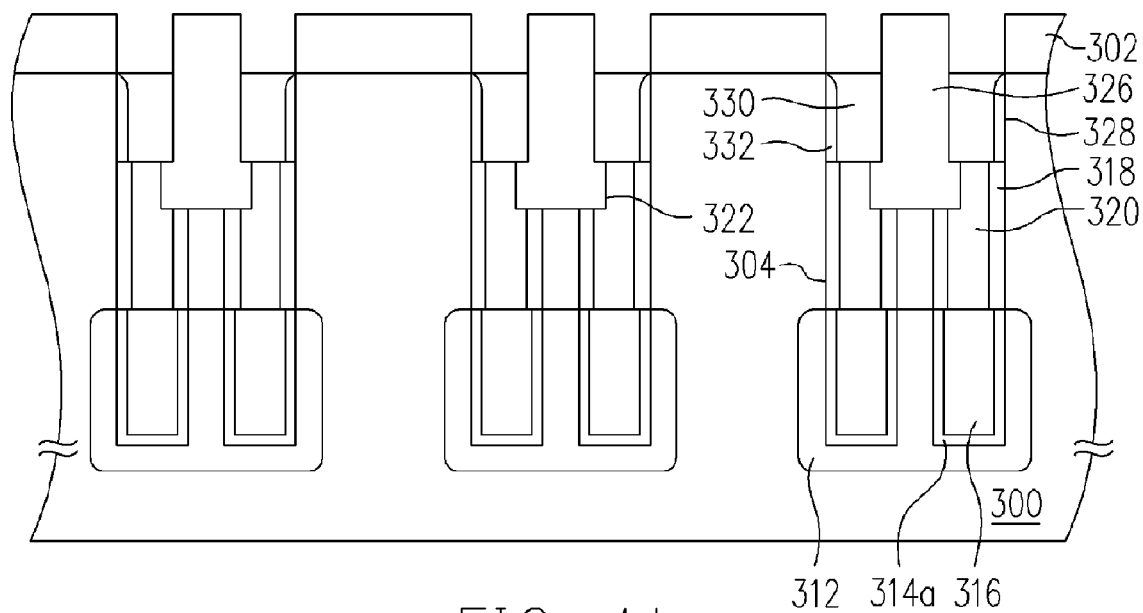

Referring to FIG. 4J, a conductive layer 330 fills each opening 328. Specifically, the expanded width 344 of the opening 328 can preclude the formation of void when the opening 328 is filled with the conductive layer 330. Since the presence of voids in the conductive layer would create problems in electrical connection in the conductive layer, a wider opening 328 can prevent such problems from occurring in the conductive layer.

In one embodiment, before forming the opening 328 and filling the opening 328 with the conductive layer 330, a dielectric layer 332 is formed on the exposed substrate 330 surface of the sidewall of each opening 328.

Figure 4K:
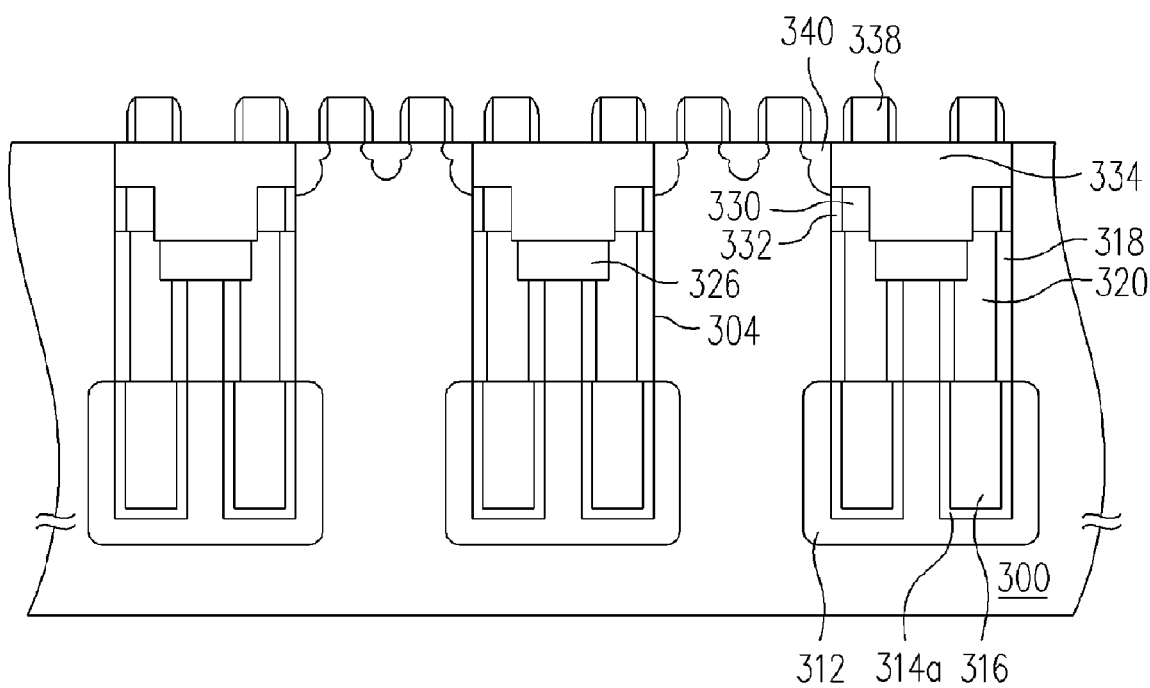
FIG. 4K is a schematic cross-sectional view diagram illustrating the plurality of deep trench capacitors in a selected process of the fabrication according to one embodiment of the present invention.

Thereafter, the fabrication of the active device proceeds after the fabrication of the deep trench capacitor is completed. Referring concurrently to FIGS. 3 and 4K, an isolation structure 334 is formed in the conductive layers 320, 330 and in the substrate 300 between two neighboring deep trenches 304 to define the device active area (AA) 336. The remaining patterned mask layer 302 is removed, and devices 338 are formed on the surfaces of the substrate 300 and the isolation structure 334. Additionally, during the formation of the isolation structure 334, a buried strap (BS) 340 is formed in the substrate bordering on the conductive layer 330 (or the dielectric layer 332, in the case, the dielectric layer 332 is formed on the sidewall of the trench). The fabrication processes and the related process parameters for the above device active area 336, isolation structures 334 and devices 338 are well known to those skilled and their description are omitted herein.

It is important to note that misalignment may easily occur during the definition of the active area when the active area has an oval shape. Since the device active area 336 of the present invention has a stripe shape, the problem of misalignment during the definition of the active region is mitigated.

The structure of a deep trench capacitor fabricated with the foregoing fabrication method will now be described more fully hereinafter.

Referring to FIG. 4K, the above deep trench capacitor includes a bottom electrode 312, a conductive layer 316, a capacitor dielectric layer 314a, a conductive layer 320, a collar oxide layer 318, a conductive layer 330, an isolation structure 334, an isolation layer 326, and a dielectric layer 332.

The bottom electrode 312 is disposed in the substrate 300 outside the bottom of the deep trench 304, and the conductive layer 316 is disposed at the bottom of the deep trench 304. Further, the capacitor dielectric layer 314a is disposed on the surface of the deep trench 304 surrounding the conductive layer 316. Further, the conductive layer 320 is disposed in the deep trench 304 above the conductive layer 316. The collar oxide layer 318 is disposed on the surface of the deep trench 304 surrounding the conductive layer 320. The conductive layer 330 is disposed in the deep trench 304 above the conductive layer 320.

In addition, the isolation structure 334 is disposed in parts of the conductive layer 330 and the conductive layer 320 and in the substrate 300 between two adjacent deep trenches 304. Further, the dielectric layer 332 is disposed between the surface of the deep trench 304 and the conductive layer 330.

The isolation layer 326 is disposed under the isolation structure 334 in the substrate 300 and crosses between portions of the conductive layers 320 of two adjacent trenches 304. The isolation layer 326 includes silicon oxide, for example. The isolation layer 326 can prevent an electrical conduction between two neighboring conductive layers and an electrical short of the device.

In accordance with the above description of the present invention, before the formation of the isolation structure, an isolation layer fills the deep trench. Therefore, even the top film layer is etched, the isolation between the neighboring deep trenches is preserved. A short of a device leading to an operative capacitor is prevented even the top film layer is etched.

Moreover, during the defining of the deep trench, whether the mask layer and the underlying substrate are removed or not, the structures adjacent to the isolation structure are assured to be completely isolated, to prevent any short of a device induced by an electrical connection between devices proximal to the deep trenches.

Further, the depth of the deep trench capacitor of the present invention is greater for increasing the capacity of the capacitor. In other words, the present invention is contrary to the conventional practice in which a shallower capacitor is formed to prevent the top film of the deep trench capacitor from being etched but to affect the yield and the reliability of the device. Instead, the present invention provides a deeper trench to obtain a higher capacity while the problems of the top film of the deep trench capacitor being etched are prevented.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating a deep trench capacitor, the method comprising:
   performing a patterning process to form a plurality of deep trenches in the substrate using a patterned mask disposed above a substrate;
   forming a bottom electrode in the substrate surrounding a bottom of each deep trench;
   forming sequentially a capacitor dielectric layer and a first conductive layer at the bottom of each deep trench;
   forming a collar oxide layer on a sidewall of each deep trench exposed by the first conductive layer;
   filling each deep trench with a second conductive layer, wherein the second conductive layer at least fully fills each deep trench;
   removing the patterned mask layer and a portion of the substrate between two neighboring deep trenches and removing portions of the second conductive layer and the collar oxide layer in the two deep trenches to form a first opening, wherein the first opening is formed at a region for forming a predetermined isolation structure between the two neighboring deep trenches, and a depth of the first opening is greater than a depth of the predetermined isolation structure; and
   filling the first opening with an isolation layer.

2. The method of claim 1, wherein forming the first opening comprises:
   forming a patterned photoresist layer on the patterned mask layer and a portion of the second conductive layer, wherein the patterned photoresist layer exposes the region for forming the predetermined isolation structure;
   performing an etching process to remove the portion of the second conductive layer and a portion of the substrate;
   removing the photoresist layer; and
   removing the collar oxide layer not covered by the second conductive layer.

3. The method of claim 2, wherein removing the collar oxide layer not covered by the second conductive layer comprises using a buffer hydrofluoric acid.

4. The method of claim 1, wherein a bottom of the first opening is disposed at about 3500 angstroms to about 4000 angstroms below an upper surface of the substrate.

5. The method of claim 1, wherein the isolation layer comprises a silicon oxide material.

6. The method of claim 1, wherein forming the isolation layer comprises:
   filling an insulation material layer in the first opening; and
   removing the insulation material layer outside the first opening.

7. The method of claim 6, wherein forming the insulation material comprises performing a process selected from the group consisting of a high density plasma chemical vapor deposition process and a semi-atmospheric chemical vapor deposition process.

8. The method of claim 6, wherein removing the insulation material layer outside the first opening comprises performing a chemical mechanical polishing process or an etching-back process.

9. The method of claim 1, further comprising removing portions of the second conductive layer and the collar oxide layer at a periphery of the isolation layer to form corresponding second openings, and filling a third conductive layer in the second openings.

10. The method of claim 9, wherein a depth of each second opening is shallower than the depth of the first opening.

11. The method of claim 9, wherein after forming the second openings and before filling in the third conductive layer, the method further comprises removing a portion of the isolation layer to expand a width of the second opening.

12. The method of claim 11, wherein removing the portion of the isolation layer comprises using a buffer hydrofluoric acid.

13. The method of claim 9, wherein after forming the second opening and before filling the third conductive layer, the method further comprises forming a dielectric layer on an exposed substrate of a sidewall of the second opening.

14. The method of claim 9, wherein after filling the third conductive layer, the method further comprises forming an isolation structure in parts of the isolation layer, the third conductive and the second conductive layer of the two neighboring deep trenches.

15. The method of claim 14, wherein when the isolation structure is formed, the method further comprises forming a buried strap in the substrate bordering on the third conductive layer.

16. The method of claim 1, wherein performing the patterning process to form the deep trenches further comprises removing the patterned mask layer and the portion of the substrate between the two neighboring deep trenches.

* * * * *